United States Patent

Jones

[15] 3,650,754

[45] Mar. 21, 1972

[54] PHOTORESIST COMPOSITIONS CONTAINING LIMED ROSIN AND PHOTOACTINATOR

[72] Inventor: Viron V. Jones, Caldwell, N.J.

[73] Assignee: Keuffel & Esser Company, Morristown, N.J.

[22] Filed: July 31, 1969

[21] Appl. No.: 846,616

[52] U.S. Cl. ....................96/88, 96/115, 96/36

[51] Int. Cl. ....................G03c 1/00, G03c 1/68

[58] Field of Search ....................96/88, 36, 115, 33

[56] References Cited

UNITED STATES PATENTS 2,297,691 10/1942 Carlson ....................96/36 X

*Primary Examiner*—Norman G. Torchin
*Assistant Examiner*—Won H. Louie, Jr.
*Attorney*—J. Russell Juten, Peter F. Willig, Lionel N. White and Milford A. Juten

[57] ABSTRACT

A layer of limed rosin sensitized with a photoactive dye or a photosensitive organic polyhalogen compound is normally hydrophobic, but is rendered soluble in weakly alkaline aqueous solution upon exposure to light. When over-coated upon a hydrophilic base sheet these limed rosin materials provide aqueous-developable, positive-working lithographic printing plates, or when coated upon film layers soluble in aqueous solutions they provide for aqueous-developable reproduction sheets by means of etching processes.

9 Claims, No Drawings

PHOTORESIST COMPOSITIONS CONTAINING LIMED ROSIN AND PHOTOACTINATOR

BACKGROUND OF THE INVENTION

Photoresist materials have long been known and employed in at least two broad fields. These materials, which upon exposure to light exhibit a change in solubility, have been utilized to a great extent in the graphic arts and more recently in the chemical etching or chemical milling arts. In the former, direct photo reproductions are prepared by means of light exposure of photoresist materials followed by wash-off development with solutions in which one of the exposed or unexposed portions of the photoresist is substantially soluble. By employing the photoresist layer with suitable supports, lithographic plates, silk screen stencils, and similar printing masters may be prepared. In the latter art, developed photoresists overlay and protect various metal or other etchable sheets or layers and provide means for selective etching or "milling" of such supports. The manufacture of printed and integrated circuits for the electronics industry are typical of the use of photoresists in chemical milling procedures.

Numerous types of photoresist material have heretofore been employed and are described in numerous publications, for example, *Light Sensitive Systems* by Jaromir Kosar, John Wiley & Sons, Inc., 1965. Among the early types of photoresists are the dichromated colloids which become water insolubilized upon exposure to light and are thus negative working. Other such negative-working photoresist materials include the cinnamic acid derivatives and the photopolymerizable vinyl compositions.

More recently, positive-working photoresist materials such as the naphthoquinone diazides which are rendered more soluble upon exposure to light have been described (U.S. Pat. Nos. 3,046,114; 3,106,465; 3,148,983). Other positive-working photoresist materials which have been described include cyclic sulfonium perchlorates, quinoline quinone diazide, and certain aryl azides U.S. Pat. Nos. 2,859,111; 2,859,112, 3,046,131; 3,092,494).

SUMMARY OF THE INVENTION

The present invention provides a photoresist composition which is positive-working and developable in aqueous alkaline solutions and which is substantially less expensive and more readily obtainable than the more exotic naphthoquinone diazides and aryl azides heretofore known. The materials of the present invention comprise a mixture of limed rosin or limed rosin derivatives with one or more photosensitive initiators selected from the group of photoactive dyes, that is dyes which are actively reduced or oxidized, depending upon their environment, when exposed to light, and organic polyhalogen compounds which are known to be sources of photo-initiated halogen free radicals and have been widely described, for example by Wainer U.S. Pat. Nos. 3,042,515; 3,042,516.

The limed rosin and photo-initiator material are coated upon selected substrates out of simple solutions in common solvents and are dried to provide the typical resist layer. Imagewise light exposure followed by the application of aqueous alkaline solution renders the light-exposed areas of the resist layer readily removable directly or in a final water rinse to reveal the underlying substrate which may be functional per se as a hydrophilic surface for lithographic printing or may be susceptible to etching or dissolution in various aqueous solutions. The unexposed limed rosin composition remaining upon the substrate provides adequate protection for the underlying surface in etching or chemical milling operations and also forms a hydrophobic ink-receptive reproduction of the exposure original for lithographic printing procedures.

In addition to their use as protective resists, the materials of the instant invention may be employed in the formation of direct-positive reproduction images by the simple incorporation of coloring matter in the composition. Upon light exposure such layers are developed by washing in slightly alkaline solutions to remove the light-exposed areas, and the unexposed areas corresponding to the indicia of the original remain upon the carrier sheet as a colored reproduction of the original, the color normally being selected to contrast with that of the substrate. Transparent dye coloring matter employed in this manner in combination with transparent substrates provide good copies for use as overhead projection masters.

DESCRIPTION OF THE INVENTION

A rosin derivative employed in the present invention is commercially available and is generally prepared by heating calcium hydroxide with molten natural rosin. The resulting materials which have been found particularly useful are rosins which have been limed to between 2.5 percent and 6 percent. In addition to the natural rosin product, rosin derivatives including abietic acid, dehydrogenated abietic acid, and dimerized rosin may be usefully employed in the invention when limed to a similar degree.

The limed rosin or rosin derivatives normally insoluble in water and slightly alkaline aqueous solutions are rendered capable of light-initiated alkaline solubility when combined in organic solvent solution with about 15 to 20 percent, based on the amount of limed rosin, of a photo-reducible dye such as rose bengal. The limed rosin may similarly be combined with a photosensitive polyhalogen compound such as carbon tetrabromide to provide a light-sensitive alkaline developable resist layer. Amounts of polyhalogen between about 10 and 30 percent of the limed rosin have been found to be useful.

While, as noted, either of the photoactive dye or organic polyhalogen compounds may be usefully employed with the limed rosin, it is particularly effective to combine these photo initiators in the coating composition with the limed rosin. As little as 0.2 to 2.0 percent of the dye, rose bengal, for example, added to a carbon tetrabromide sensitized lime rosin composition, doubles the light sensitivity of the photoresist layer and substantially eliminates image spread and provides particularly clear, sharp image reproductions.

Typical polyhalogen compounds useful in the present invention are: Carbontetrobromide, hexabromoethane, iodoform,www,tribromo acetophenone, www,tribromo phenylsulfone, tribromo methylphenylsulfone, di-tribromomethylsulfone, hexabromodimethylsulfone, 2, 2-dibromo-1,3-diphenylpropanedione, 2,2-dibromo-1,3-indenedione,www-tribromoquinaldine, hexachloroethane, 2,2-dibromoacetoacetanilide, and ethyl-2,2-dibromoacetoacetate.

Of the numerous dye activators useful in the present invention are the xanthine dyes: Rose Bengal (C.I.45440), eosin Y (C.I. 45380), rodomine B (C.I. 45170), rhodamine 6G (C.I. 45160), erythrosine B (C.I. 45430), phloxine B (C.I. 45410); the triphenylmethane dyes: Crystal violet (C.I. 42555), victoria blue B (C.I. 44045), fuchsine (C.I. 42510), pararosaniline (C.I. 42500); the thiazine dyes: methylene blue (C.I. 52015); and the indicator dyes: bromophenol blue (2,3,6,7-tetrabromophenol sulfonphthalein).

In addition to other common uses in preparation of direct positive wash-off images and as the resist materials for chemical etching the present compositions are particularly useful in the formation of reproduction masters in the cartographic arts. Such materials are prepared by coating on a transparent substrate, such as polyethylene terephtalate film, a layer of polymeric material which is soluble or swellable in aqueous solution and overcoating such a layer with a composition of the present invention. The underlayer is generally a self-sustaining film-forming polymer, such as polyvinyl alcohol or a methoxymethylated hexamethylene diamine/adipic acid polyamide, which, due to the typical nature of the polyester substrates, is peelable from the surface of the underlying plastic film layer. Imagewise exposure of the master material renders exposed areas of the photoresist composition (overlayer) soluble in an aqueous alkaline solution, for example, a buffered solution of disodium phosphate heptahydrate and potassium carbonate. Swab application of this developer solution to the surface of the material readily removes the light exposed areas and reveals the underlying polymer layer of, for example, polyvinyl alcohol. The rate of etching when more generally soluble underlayers such as polyvinyl alcohol are employed is controlled in a known manner by including ethylene glycol or glycerin in the developing solution. The use of other selected underlayers, such as the noted polyamide film layer, are particularly desirable where the etching solution may be prepared to have a more selective effect upon the underlayer. Other useful polyamide resins useful as peelable layers are described in U.S. Pat. Nos. 2,285,009; 2,441,057; and 2,430,860.

Incorporation of light-absorbing dyes and pigments, particularly ultraviolet light-absorbing compounds in the peelable underlayer results, upon etching away revealed portions of the underlayer, in a positive reproduction of original masters. These reproductions are particularly useful in preparing cartographic printing plates and the like. The peelable nature of the underlayer is additionally useful where it is desired to remove large areas from within etched outlines on the master.

PREFERRED EMBODIMENTS

Example 1

A solution was prepared of 2.0 ml. methylisobutyl ketone, 2.0 ml. methyl cellosolve acetate and one gram of limed rosin (5.5% limed). To this solution was added 0.2 grams rose bengal dye dissolved in about 0.5 ml. of a warmed mixture of methanol and methyl cellosolve (50/50). The resulting composition was coated to a dry thickness of about 8 microns on a film of polyethylene terephthalate and was dried in warm air. The coated material was exposed through a lined negative to a 375W sun lamp from a distance of about 15 cm. for a period of 4 minutes. The exposed film was bathed for 10–20 seconds in a solution of 5 grams disodium phosphate heptahydrate and 5 grams of potassium carbonate in 100 ml. of water and was rinsed with clear water and dried. Close examination revealed that the light-exposed areas of the material were cleanly removed to the surface of the polyester base film.

Example 2

In the coating composition of Example 1 there was substituted for the rose bengal 0.3 grams of carbon tetrabromide. A dry coating of about 10 microns of the composition on a polyethylene terephthalate polyester film provided a material which yielded a clear positive reproduction after exposure for 8 minutes to the sun lamp source as in Example 1 and developing in the buffer solution.

Example 3

The coating composition of Example 2 was varied by the substitution of 0.2 grams hexabromoethane for the carbon tetrabromide sensitizer. A coating of this composition to provide a dry layer of about 5 microns thickness on a polyethylene terephthalate polyester film resulted in a material which provided a clear image after an 8 minute exposure and buffer solution development wash as in Example 2.

Example 4

To the composition of Example 3 there was added 0.02 grams of rose bengal. A coating of about 5 microns dry thickness was prepared as in Example 3 and provided a clear image after only 4 minutes exposure to the sun lamp source upon developing with the disodium phosphate potassium carbonate buffer solution.

Example 5

A coating composition was prepared of 2 ml. methylisobutylketone, 2 ml. methylcellosolveacetate, 1 gram limed rosin (5.5 percent limed), 0.2 grams tribromoacetophenone, and 0.01 grams rose bengal. The coating composition was applied to a polyethylene terephthalate polyester film to a dry thickness of about 8 microns and was exposed for 5 minutes to a 375W sun lamp from a distance of about 15 cm. The exposed sheet was developed in the buffer solution developer of Example 2 to provide a clear positive reproduction of the original.

Example 6

A positive working resist material of equivalent sensitivity and developability to the material of Example 5 was prepared by substituting 0.2 grams of www-tribromoquinaldine for the tribromoacetophenone in the composition of Example 5.

Example 7

A coating composition of 5 ml. ethylacetate, 1 gram limed rosin (5.5 percent limed), 0.3 grams carbon tetrabromide, and 0.02 grams pararosaniline was coated on a polyester base sheet to a dry thickness of about 8 microns. Exposure of the resulting material to a 375W sun lamp through a line negative provided a material which was developable in about 2 minutes in a solution of 2.5 grams disodium phosphate heptahydrate, 2.5 grams potassium carbonate and 100 ml. of water.

Example 8

Substitution of rhodamine B for the pararosaniline of Example 7 provided a positive photoresist material of comparable quality.

Example 9

The following is a typical example of the use of the compositions of the present invention as resist layers in the preparation of cartographic reproduction masters. A polyethylene terephthalate polyester film base was coated to a dried thickness of about 12 microns with a 15 percent methanol solution of N-methoxymethyl polyhexamethylene diammonium adipate (35 percent methoxy-methyl substitution) containing about 10 percent (dry basis) C.I. solvent red dye. On the dry polyamide layer was coated the composition of Example 7 to a dry thickness of about 8 microns. The resulting material was exposed for 4 minutes through a line negative to a 375W sun lamp from a distance of about 15 cm. and was thereafter developed in the buffer solution of Example 7. After rinsing and drying the developed layer, the material was swabbed with an absorbent cotton pad saturated with a 25 percent aqueous solution of sodium salicylate. Portions of the polyamide layer corresponding to the original negative line image (i.e., the light struck areas) were cleanly removed from the polyamide base and resulted in a red dyed reproduction of the original exposure negative. Areas of the material layer enclosed within a clear line were readily peeled from the polyester base sheet to form open window areas in the reproduction master. The resulting reproduction master provided high contrast diazotype reproductions and evidenced the utility of the reproduction master as an original for the preparation of the photo lithographic plates, cartographic printing plates, and engineering drawing reproductions.

The above examples have been presented for the purpose of illustration and should not be taken to limit the scope of the present invention. It will be apparent that the described examples are capable of many variations and modifications which are likewise to be included within the scope of the present invention as set forth in the appended claims.

What is claimed is:

1. Light-sensitive material comprising:

a. a limed derivative of a compound selected from the group consisting of rosin, dimerized rosin, abietic acid, and dehydrogenated abietic acid.

b. a photosensitizer selected from the group consisting of photoactive dyes and organic polyhalogen compounds which produce halogen free radicals upon exposure to light.

2. Positive-working photoresist material comprising a supported layer of a light-sensitive material according to claim 1.

3. Material according to claim 1 wherein said limed derivative is limed to between about 2.5 and 6 percent.

4. Light-sensitive material according to claim 1 wherein said organic polyhalogen photosensitizer is present in a ratio with said limed derivative of between about 10 and 30 percent.

5. Light-sensitive material according to claim 1 wherein said dye photosensitizer is present individually in a ratio with said limed derivative of between about 15 and 20 percent.

6. Light-sensitive material according to claim 4 including between about 0.2 and 2.0 percent of said dye photosensitizer.

7. Light-sensitive imaging material comprising a layer of a composition which is etchable by water or slightly alkaline aqueous solutions, and a layer of light-sensitive material according to claim 1 overlying said etchable composition layer.

8. Material according to claim 7 wherein said etchable layer is a film-forming polymer.

9. Material according to claim 8 wherein said etchable layer includes coloring matter and is supported on a transparent base from which said layer is readily peelable.

* * * * *